US011939450B2

(12) United States Patent
Mukae et al.

(10) Patent No.: US 11,939,450 B2
(45) Date of Patent: Mar. 26, 2024

(54) RESIN COMPOSITION FOR CIRCUIT BOARD, MOLDED BODY FOR CIRCUIT BOARD, LAYERED BODY FOR CIRCUIT BOARD, AND CIRCUIT BOARD

(71) Applicant: DAIKIN INDUSTRIES, LTD., Osaka (JP)

(72) Inventors: Hirofumi Mukae, Osaka (JP); Hirokazu Komori, Osaka (JP); Masaji Komori, Osaka (JP); Hideki Kono, Osaka (JP); Ayane Nakaue, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/575,695

(22) Filed: Jan. 14, 2022

(65) Prior Publication Data

US 2022/0135767 A1 May 5, 2022

Related U.S. Application Data

(63) Continuation of application No. PCT/JP2020/027035, filed on Jul. 10, 2020.

(30) Foreign Application Priority Data

Jul. 16, 2019 (JP) ................. 2019-131261

(51) Int. Cl.
*C08K 3/38* (2006.01)
*B32B 15/082* (2006.01)
*B32B 27/20* (2006.01)
*B32B 27/30* (2006.01)
*C08F 214/26* (2006.01)
*H05K 1/03* (2006.01)
*H05K 1/02* (2006.01)

(52) U.S. Cl.
CPC .............. *C08K 3/38* (2013.01); *B32B 15/082* (2013.01); *B32B 27/20* (2013.01); *B32B 27/304* (2013.01); *C08F 214/262* (2013.01); *C08F 214/265* (2013.01); *H05K 1/0373* (2013.01); *B32B 2250/02* (2013.01); *B32B 2264/10* (2013.01); *B32B 2307/302* (2013.01); *B32B 2457/08* (2013.01); *C08K 2003/385* (2013.01); *C08K 2201/005* (2013.01); *H05K 1/0237* (2013.01)

(58) Field of Classification Search
CPC .............................................. C08K 2003/385
See application file for complete search history.

(56) References Cited

U.S. PATENT DOCUMENTS

| 2015/0252242 A1 | 9/2015 | Pham et al. |
| 2017/0002156 A1 | 1/2017 | Chaen et al. |
| 2018/0051158 A1 | 2/2018 | Nam et al. |
| 2021/0332229 A1 | 10/2021 | Mukae et al. |

FOREIGN PATENT DOCUMENTS

| JP | 2015-127412 A | 7/2015 |
| JP | 2015-168731 A | 9/2015 |
| JP | 2015-168783 A | 9/2015 |
| JP | 2016-098301 A | 5/2016 |
| JP | 2016-166347 A | 9/2016 |
| JP | 2017-208540 A | 11/2017 |
| JP | 2018-188350 A | 11/2018 |
| WO | 2015/118858 A1 | 8/2015 |
| WO | 2019/094238 A1 | 5/2019 |
| WO | 2020/045260 A1 | 3/2020 |

OTHER PUBLICATIONS

International Preliminary Report on Patentability with a translation of Written Opinion dated Jan. 18, 2022 from the International Bureau in International Application No. PCT/JP2020/027035.
International Search Report for PCT/JP2020/027035 dated Sep. 24, 2020 (PCT/ISA/210).
Extended European Search Report dated Jun. 28, 2023 in European Application No. 20840634.8.

*Primary Examiner* — Ian A Rummel
(74) *Attorney, Agent, or Firm* — Sughrue Mion, PLLC

(57) ABSTRACT

A resin composition for a circuit board, containing a melt-fabricable fluororesin and a particulate boron nitride. The particulate boron nitride has a ratio (b)/(a) of 1.0 or higher, wherein (a) represents a proportion of particles having a particle size of 14.6 to 20.6 μm and (b) represents a proportion of particles having a particle size of 24.6 to 29.4 μm. Also disclosed is a molded article for a circuit board obtained from the resin composition, a laminate for a circuit board including a metal layer (A1) and a layer (B) obtained from the resin composition, and a circuit board including a metal layer (A2) and a layer (B) obtained from the resin composition.

10 Claims, No Drawings

RESIN COMPOSITION FOR CIRCUIT BOARD, MOLDED BODY FOR CIRCUIT BOARD, LAYERED BODY FOR CIRCUIT BOARD, AND CIRCUIT BOARD

CROSS REFERENCE TO RELATED APPLICATIONS

This application is a Rule 53(b) Continuation of International Application No. PCT/JP2020/027035 filed Jul. 10, 2020, claiming priority based on Japanese Patent Application No. 2019-131261 filed Jul. 16, 2019, the respective disclosures of which are incorporated herein by reference in their entirety.

TECHNICAL FIELD

The disclosure relates to resin compositions for circuit boards, molded articles for circuit boards, laminates for circuit boards, and circuit boards.

BACKGROUND ART

Circuit boards used for electric devices, electronic devices, and telecommunication devices need to have a variety of characteristics in accordance with their applications.

Patent Literature 1 discloses a resin composition for a dielectric, containing isotactic polypropylene and anisotropic magnesium oxide particles.

CITATION LIST

Patent Literature
Patent Literature 1: JP 2015-168731 A

SUMMARY

The disclosure relates to a resin composition for a circuit board containing a melt-fabricable fluororesin and a particulate boron nitride.

Advantageous Effects

The disclosure can provide a resin composition for a circuit board having excellent low-dielectric characteristics and excellent heat dissipation, a molded article for a circuit board, a laminate for a circuit board, and a circuit board.

DESCRIPTION OF EMBODIMENTS

The disclosure is specifically described hereinbelow.
The disclosure relates to a resin composition for a circuit board containing a melt-fabricable fluororesin and a particulate boron nitride.

The resin composition of the disclosure contains a particulate boron nitride. The boron nitride is a filler having a low dissipation factor. The resin composition containing a particulate boron nitride thus can have a reduced dissipation factor while maintaining a low permittivity of the fluororesin, and is therefore suitably used for a circuit board.

Recent devices such as electric devices, electronic devices, and telecommunication devices tend to utilize frequencies within a high frequency band. Accordingly, circuit boards used for these devices also need to have excellent electric characteristics compatible with frequencies within a high frequency band. In particular, to reduce a transmission loss, circuit boards need to have low-dielectric characteristics (low permittivity and low dissipation factor).

In addition to the low-dielectric characteristics, the resin composition of the disclosure has good heat conduction and therefore has excellent heat dissipation.

Circuit boards used for small components include high-density packaging of electronic parts and therefore need to have high heat dissipation (heat conduction) to prevent malfunctioning due to heat from highly heat-generating parts.

The resin composition of the disclosure has the aforementioned structure, and thus has excellent low-dielectric characteristics and excellent heat dissipation. Accordingly, when applied to a circuit board and used even in a high frequency band, the product shows a low energy loss. Further, this structure allows mounted components such as ICs to store less heat, which enables stable communications.

The resin composition of the disclosure also has excellent moldability, excellent low thermal expansion, excellent toughness, and excellent heat resistance.

The resin composition of the disclosure contains a melt-fabricable fluororesin. In comparison with resin compositions containing non melt-processible fluororesin (for example, a resin composition containing polytetrafluoroethylene as disclosed in US 2019/0136109), the resin composition of the disclosure has better moldability and can be subjected to extrusion molding, for example. Accordingly, the resin composition of the disclosure can be easily processed into a shape such as a sheet or film suitable for a circuit board.

The term "melt-fabricable" herein means that a polymer can be melted and processed using a conventional processing device such as an extruder or an injection molding machine.

The fluororesin preferably has a melting point of 100° C. to 360° C., more preferably 140° C. to 350° C., still more preferably 160° C. to 320° C.

The melting point herein is the temperature corresponding to the maximum value on a heat-of-fusion curve drawn by increasing the temperature at a rate of 10° C./min using a differential scanning calorimeter (DSC).

The fluororesin preferably has a melt flow rate (MFR) of 10 g/10 min or higher, more preferably 20 g/10 min or higher, while preferably 200 g/10 min or lower, more preferably 100 g/10 min or lower.

The MFR of the fluororesin is a value obtained as the mass (g/10 min) of a polymer that flows out of a nozzle having an inner diameter of 2 mm and a length of 8 mm per 10 minutes at a predetermined measurement temperature (e.g., 372° C. for PFA and FEP to be described later, 297° C. for ETFE) and load (e.g., 5 kg for PFA, FEP, and ETFE) in accordance with the type of the fluoropolymer using a melt indexer in conformity with ASTM D1238.

Examples of the fluororesin include a tetrafluoroethylene (TFE)/perfluoro(alkyl vinyl ether) (PAVE) copolymer (PFA), a TFE/hexafluoropropylene (HFP) copolymer (FEP), an ethylene (Et)/TFE copolymer (ETFE), an Et/TFE/HFP copolymer (EFEP), polychlorotrifluoroethylene (PCTFE), a chlorotrifluoroethylene (CTFE)/TFE copolymer, an Et/CTFE copolymer, polyvinyl fluoride (PVF), and polyvinylidene fluoride (PVDF).

In particular, the fluororesin preferably includes at least one selected from the group consisting of PFA, FEP, and ETFE, more preferably at least one selected from the group consisting of PFA and FEP, and is still more preferably PFA.

The fluororesin is also preferably a perfluororesin.

The PFA is preferably, but is not limited to, a copolymer having a ratio by mole (TFE unit/PAVE unit) of a TFE unit to a PAVE unit of 70/30 or higher and lower than 99/1, more preferably 70/30 or higher and 98.9/1.1 or lower, still more preferably 80/20 or higher and 98.9/1.1 or lower. Too small an amount of the TFE unit tends to cause reduced mechanical properties. Too large an amount thereof tends to cause too high a melting point and reduced moldability. The PFA is also preferably a copolymer containing a monomer unit derived from a monomer copolymerizable with TFE and PAVE in an amount of 0.1 to 10 mol % and containing the TFE unit and the PAVE unit in a total amount of 90 to 99.9 mol %. Examples of the monomer copolymerizable with TFE and PAVE include HFP, a vinyl monomer represented by $CZ^3Z^4=CZ^5(CF_2)_nZ^6$ (wherein $Z^3$, $Z^4$, and $Z^5$ are the same as or different from each other and are each a hydrogen atom or a fluorine atom; $Z^6$ is a hydrogen atom, a fluorine atom, or a chlorine atom; and n is an integer of 2 to 10), and an alkyl perfluorovinyl ether derivative represented by $CF_2=CF-OCH_2-Rf^7$ wherein $Rf^7$ is a C1-C5 perfluoroalkyl group).

The PFA preferably has a melting point of 180° C. to lower than 324° C., more preferably 230° C. to 320° C., still more preferably 280° C. to 320° C.

The FEP is preferably, but is not limited to, a copolymer having a ratio by mole (TFE unit/HFP unit) of a TFE unit to a HFP unit of 70/30 or higher and lower than 99/1, more preferably 70/30 or higher and 98.9/1.1 or lower, still more preferably 80/20 or higher and 98.9/1.1 or lower. Too small an amount of the TFE unit tends to cause reduced mechanical properties. Too large an amount thereof tends to cause too high a melting point and reduced moldability. The FEP is also preferably a copolymer containing a monomer unit derived from a monomer copolymerizable with TFE and HFP in an amount of 0.1 to 10 mol % and containing the TFE unit and the HFP unit in a total amount of 90 to 99.9 mol %. Examples of the monomer copolymerizable with TFE and HFP include PAVE and an alkyl perfluorovinyl ether derivative.

The FEP preferably has a melting point that is lower than the melting point of the PTFE and is 150° C. to lower than 324° C., more preferably 200° C. to 320° C., still more preferably 240° C. to 320° C.

The ETFE is preferably a copolymer having a ratio by mole (TFE unit/ethylene unit) of a TFE unit to an ethylene unit of 20/80 or higher and 90/10 or lower, more preferably 37/63 or higher and 85/15 or lower, still more preferably 38/62 or higher and 80/20 or lower. The ETFE may be a copolymer containing TFE, ethylene, and a monomer copolymerizable with TFE and ethylene. Examples of the copolymerizable monomer include monomers represented by the following formulae:
$CH_2=CX^5Rf^3$, $CF_2=CFRf^3$, $CF_2=CFORf^3$, and $CH_2=C(Rf^3)_2$ wherein $X^5$ is a hydrogen atom or a fluorine atom; and $Rf^3$ is a fluoroalkyl group optionally containing an ether bond.

Preferred among these are fluorine-containing vinyl monomers represented by $CF_2=CFRf^3$, $CF_2=CFORf^3$, and $CH_2=CX^5Rf^3$, more preferred are HFP, a perfluoro(alkyl vinyl ether) represented by $CF_2=CF-ORf^4$ (wherein $Rf^4$ is a C1-C5 perfluoroalkyl group), and a fluorine-containing vinyl monomer represented by $CH_2=CX^5Rf^3$ (wherein $Rf^3$ is a C1-C8 fluoroalkyl group). The monomer copolymerizable with TFE and ethylene may be an aliphatic unsaturated carboxylic acid such as itaconic acid or an itaconic anhydride. The monomer copolymerizable with TFE and ethylene is preferably in an amount of 0.1 to 10 mol %, more preferably 0.1 to 5 mol %, particularly preferably 0.2 to 4 mol %, relative to the fluorine-containing polymer.

The ETFE preferably has a melting point of 140° C. to lower than 324° C., more preferably 160° C. to 320° C., still more preferably 195° C. to 320° C.

The amounts of the respective monomer units of the aforementioned copolymers each can be calculated by any appropriate combination of NMR, FT-IR, elemental analysis, and X-ray fluorescence analysis in accordance with the types of the monomers.

In terms of the adhesiveness to a metal layer, the fluororesin may contain a carbonyl group-containing functional group in the main chain backbone.

Examples of the functional group include substructures of chemical structures, such as a carbonate group, a carboxylic halide group (halogenoformyl group), a formyl group, a carboxyl group, an ester group ($-C(=O)O-$), an acid anhydride group ($-C(=O)O-C(=O)-$), an isocyanate group, an amide group, an imide group ($-C(=O)-NH-C(=O)-$), a urethane group ($-NH-C(=O)O-$), a carbamoyl group ($NH_2-C(=O)-$), a carbamoyloxy group ($NH_2-C(=O)O-$), a ureido group ($NH_2-C(=O)-NH-$), and an oxamoyl group ($NH_2-C(=O)-C(=O)-$).

Hydrogen atoms bonding to any nitrogen atom in functional groups such as an amide group, an imide group, a urethane group, a carbamoyl group, a carbamoyloxy group, a ureido group, and an oxamoyl group may be replaced by a hydrocarbon group such as an alkyl group.

In order to achieve excellent adhesiveness to a metal layer, the functional group preferably includes at least one selected from the group consisting of a carboxyl group, an ester group, and an isocyanate group. Particularly preferred among these is a carboxyl group.

In terms of the adhesiveness to a metal layer, the fluororesin preferably contains five or more functional groups per $10^6$ main chain carbon atoms. In order to achieve much better adhesiveness, the number of functional groups is more preferably 20 or more, still more preferably 50 or more, particularly preferably 80 or more, still particularly preferably 100 or more, per $10^6$ main chain carbon atoms. The number of functional groups is preferably 8000 or less, more preferably 1000 or less, per $10^6$ main chain carbon atoms.

A fluororesin containing a carbonyl group-containing functional group in the aforementioned proportion may be produced by any method. The functional group may be introduced into the fluororesin by, for example, any known method such as a method of forming the functional group as an end derived from an initiator, a method of using, as a third monomer, a functional group-containing monomer to serve as a source of the functional group, and a method of bonding a structural unit containing the functional group by grafting.

Any appropriate combination of the above methods allows the number of carbonyl group-containing functional groups to fall within the aforementioned range.

For example, the amount of the carbonyl group-containing functional group formed as an end derived from an initiator may be controlled to a predetermined value in accordance with factors such as choice of an initiator for polymerization, amount thereof, and a method of adding the initiator. Also, in the case of other methods, the amount of the functional group may be controlled to a predetermined value in accordance with factors such as the amount of a functional group-containing monomer used to serve as a source of the functional group and the reaction amount in the grafting.

The number of carbonyl group-containing functional groups is measured by the following method.

A sample is compression-molded at 350° C. to form a film having a thickness of 0.25 to 0.3 mm. This film is scanned 40 times and analyzed to provide an infrared absorption spectrum using a Fourier transform infrared (FT-IR) spectrometer (trade name: 1760X, available from PerkinElmer Co., Ltd.). Then, a difference spectrum is obtained with a base spectrum of a sample which is completely fluorinated and thus contains no functional group. Based on the absorption peak of the carbonyl group in this difference spectrum, the number N of carbonyl group-containing functional groups per $1 \times 10^6$ carbon atoms in the sample is calculated by the following formula.

$$N = I \times K / t$$

I: absorbance
K: correction coefficient
t: thickness of film (mm)

The fluororesin is preferably contained in an amount of 35 to 70% by mass relative to the resin composition. The amount is preferably 45% by mass or more, more preferably 48% by mass or more, still more preferably 50% by mass or more, while preferably 65% by mass or less, more preferably 62% by mass or less.

The particulate boron nitride contained in the resin composition is preferably in the form of hexagonal boron nitride (hBN) particles.

The particulate boron nitride contained in the resin composition preferably has a 50% particle size (D50) of 3.0 μm or smaller, more preferably 2.8 μm or smaller. The 50% particle size is also preferably 2.0 μm or greater, more preferably 2.2 μm or greater.

This allows the resin composition to have further improved characteristics. In particular, the resin composition is allowed to have a MFR within the range to be described later and to have much better moldability. Further, relatively large particles occupy a small proportion in this case, which enables stress dispersion and allows the resin composition to have a high tensile strain at break and to have improved toughness.

The 50% particle size can be determined from the particle size distribution determined using a laser diffraction particle size distribution analyzer.

The particle size distribution of the particulate boron nitride herein is determined using a laser diffraction particle size distribution analyzer (RODOS T4.1, available from Sympatec GmbH) under the following conditions.
(Measurement Conditions)
Measurement range: R1 (0.18 to 35 μm)
Dispersion pressure: 3 bar
Amount of sample: 1 g The particulate boron nitride contained in the resin composition preferably has a 90% particle size (D90) of 9.0 μm or smaller, more preferably 8.0 μm or smaller, still more preferably 7.0 μm or smaller. The 90% particle size is also preferably 3.0 μm or greater, more preferably 4.0 μm or greater, still more preferably 5.0 μm or greater.

This allows the resin composition to have further improved characteristics. In particular, the resin composition is allowed to have both heat dissipation and moldability at a much higher level.

The 90% particle size can be determined from the particle size distribution determined using a laser diffraction particle size distribution analyzer.

The particulate boron nitride contained in the resin composition preferably has a proportion (a) of particles having a particle size of 14.6 to 20.6 μm of 5.0% or lower, more preferably 4.0% or lower, still more preferably 3.0% or lower, further more preferably 2.0% or lower, particularly preferably 1.0% or lower. The proportion (a) may also be 0.01% or higher.

This allows the resin composition to have further improved characteristics. In particular, the resin composition is allowed to have both heat dissipation and moldability at a much higher level.

The proportion (a) can be determined from the particle size distribution determined using a laser diffraction particle size distribution analyzer.

The particulate boron nitride contained in the resin composition preferably has a proportion (b) of particles having a particle size of 24.6 to 29.4 μm of 10.0% or lower, more preferably 5.0% or lower, still more preferably 2.0% or lower, particularly preferably 1.5% or lower. The proportion (b) may also be 0.1% or higher.

This allows the resin composition to have further improved characteristics. In particular, the resin composition is allowed to have both heat dissipation and moldability at a much higher level.

The proportion (b) can be determined from the particle size distribution determined using a laser diffraction particle size distribution analyzer.

The particulate boron nitride contained in the resin composition preferably has a ratio (b)/(a) of 1.0 or higher, more preferably 1.1 or higher, while preferably 20.0 or lower, more preferably 10.0 or lower, still more preferably 5.0 or lower, wherein (a) represents the proportion of particles having a particle size of 14.6 to 20.6 μm and (b) represents the proportion of particles having a particle size of 24.6 to 29.4 μm.

This allows the resin composition to have further improved characteristics. In particular, the resin composition is allowed to have a MFR within the range to be described later and to have much better moldability. Further, relatively large particles having a particle size of 24.6 to 29.4 μm, which contribute to heat conduction, occupy a certain proportion in this case. This allows the resin composition to have an increased thermal conductivity and improved heat dissipation.

The ratio may be calculated based on the proportions (a) and (b) which are obtained from the particle size distribution determined using a laser diffraction particle size distribution analyzer.

The particulate boron nitride contained in the resin composition is preferably substantially free from particles having a particle size of 35.0 μm or greater, more preferably substantially free from particles having a particle size of 30.0 μm or greater.

This allows the resin composition to have further improved characteristics. In particular, the resin composition is allowed to have both heat dissipation and moldability at a much higher level.

That the particulate boron nitride is substantially free from particles having a particle size within the above range means particles having a particle size within the above range in the particle size distribution determined using a laser diffraction particle size distribution analyzer occupy 0.1% or less.

In the case where the particle size distributions of the particulate boron nitride in the resin composition are within the aforementioned respective ranges, the particulate boron nitride is allowed to be present densely in the resin composition and can therefore reduce an increase in the melt viscosity. The presence of a reasonably large particulate boron nitride leads to excellent heat conduction. This results in a resin composition having excellent heat dissipation and maintaining the fluidity (excellent moldability).

Herein, the particle size distributions of the particulate boron nitride in the resin composition may be those determined for particulate boron nitride residues obtained by incinerating the resin composition.

The particulate boron nitride is preferably contained in an amount of 30 to 65% by mass relative to the resin composition. The amount is preferably 35% by mass or more, more preferably 38% by mass or more, while preferably 60% by mass or less, more preferably 55% by mass or less.

The particulate boron nitride in an amount within the above range allows the resin composition to have much improved low-dielectric characteristics and much improved heat dissipation.

In conventional cases, blending a large amount of particulate boron nitride to fluororesin tends to cause a significantly high melt viscosity, making it difficult to mold the composition. In contrast, the resin composition of the disclosure has excellent moldability even though containing a relatively large amount of particulate boron nitride as described above.

The resin composition preferably has a melt flow rate (MFR) of 5.0 g/10 min or higher. A MFR within the above range allows the resin composition to have excellent moldability. In particular, the resin composition is allowed to have moldability that enables injection molding and extrusion molding.

The MFR of the resin composition is preferably 7.0 g/10 min or higher, more preferably 10.0 g/10 min or higher, while preferably 100 g/10 min or lower, more preferably 70 g/10 min or lower, still more preferably 50 g/10 min or lower.

The MFR of the resin composition is a value determined using a die having a diameter of 2.1 mm and a length of 8 mm at a load of 5 kg and 372° C. in conformity with ASTM D-1238.

In a preferred embodiment, the melt-fabricable fluororesin represents 35 to 70% by mass and the particulate boron nitride represents 30 to 65% by mass of the resin composition, and the resin composition has a melt flow rate of 5.0 g/10 min or higher.

The resin composition of the disclosure may further contain a different component, if necessary. Examples of the different component include, but are not limited to, fibrous reinforcing materials such as potassium titanate whiskers, glass fiber, asbestos fiber, carbon fiber, ceramic fiber, potassium titanate fiber, aramid fiber, and other high-strength fiber; inorganic fillers such as talc, mica, clay, carbon powder, graphite, and glass beads; colorants; common inorganic or organic fillers such as flame retarders; lubricants such as silicone oil and molybdenum disulfide; pigments; conductive agents such as carbon black; impact resistance improvers such as rubber; glidants such as magnesium stearate; ultraviolet absorbers such as benzotriazole compounds; and other additives.

These additives may be blended within the range where the effects of the resin composition are not impaired.

The resin composition of the disclosure may be produced by, for example, mixing the fluororesin and the particulate boron nitride, as well as a different component, if necessary. The mixing may be performed using a single-screw or twin-screw extruder.

In order to achieve much improved characteristics, the resin composition is preferably obtainable by melt-kneading.

In the case of producing the resin composition by melt-kneading, the particulate boron nitride material used is preferably in the form of agglomerated particles of boron nitride. Melt-kneading this particulate boron nitride material with the fluororesin enables easy control of the MFR of the resulting resin composition to fall within the above range. Such melt-kneading also enables easy control of the particle size distribution of the particulate boron nitride in the resulting resin composition to fall within the above preferred range.

The agglomerated particles are agglomerated primary particles of boron nitride.

The particulate boron nitride material preferably has an aspect ratio (major axis/minor axis) of 1.0 to 3.0, more preferably 1.0 to 2.5.

The aspect ratio can be calculated from the major axis and the minor axis measured using a scanning electron microscope (SEM), and the aspect ratio used is an average of the aspect ratios measured for 30 samples.

Specific examples of the particulate boron nitride material include UHP-G1H available from Showa Denko K.K., CF600 available from Momentive, and FS-3 available from Mizushima Ferroalloy Co., Ltd.

The melt-kneading temperature is preferably higher than the melting point of the fluororesin, more preferably a temperature 5° C. or more higher than the melting point of the fluororesin.

The resin composition may be in any form such as powder, granules, or pellets. In order to perform easy molding, the resin composition is preferably in the form of pellets.

The resin composition of the disclosure preferably has a relative permittivity at 6 GHz and 25° C. of 3.2 or lower, more preferably 3.0 or lower, still more preferably 2.8 or lower. The lower limit may be, but is not limited to, 2.0.

The relative permittivity is measured at 6 GHz and 25° C. using a cavity resonator for permittivity measurement (available from Agilent Technologies) in conformity with ASTM D150.

The resin composition of the disclosure preferably has a dissipation factor at 6 GHz and 25° C. of $11 \times 10^{-4}$ or lower, more preferably $10 \times 10^{-4}$ or lower, still more preferably $9.0 \times 10^{-4}$ or lower. The lower limit may be, but is not limited to, $0.1 \times 10^{-4}$.

The dissipation factor is measured at 6 GHz and 25° C. using a cavity resonator for permittivity measurement (available from Agilent Technologies) in conformity with ASTM D150.

The resin composition of the disclosure preferably has a thermal conductivity of 1.5 W/m·K or higher, more preferably 2.0 W/m·K or higher, still more preferably 2.5 W/m·K or higher, particularly preferably 3.0 W/m·K or higher. A thermal conductivity within the above range allows the resin composition to have much better heat dissipation.

The thermal conductivity may be calculated as the product of the thermal diffusivity, specific heat capacity, and density measured by the following methods.
(Thermal Diffusivity)
Device: thermowave analyzer TA33 available from Bethel Co., Ltd.
Method: periodical heating radiation-temperature measurement
Measurement temperature: 25° C.

With a sample produced by the following method, measurement is performed in the thickness direction and the in-plane direction.
Sample: a 0.5-mmt plate obtained by press-molding
Measurement is performed with N=3 and the average thereof is used.
*Conditions for press-molding a sample
Device: heat press IMC-11FA available from Imoto Machinery Co., Ltd.
Molding temperature: 360° C.
Pressure: 10 MPa
Press duration: 2 min
(Specific Heat Capacity)
The specific heat capacity is measured in conformity with JIS K 7123, and the value at 25° C. is used.
(Density)
The density is measured in conformity with JIS Z 8807.

The resin composition of the disclosure is preferably one capable of providing a specimen in conformity with ASTM D790 by injection molding at a cylinder temperature of 380° C. and a mold temperature of 200° C. using a 15-t injection molding machine (M26/15B, available from Sumitomo Heavy Industries, Ltd.). Such a resin composition can have excellent injection-moldability, and thus can be extrusion-molded and easily processed into a sheet shape or film shape.

The resin composition of the disclosure preferably has a tensile strain at break of 1.0% or higher, more preferably 1.1% or higher. A tensile strain at break within the above range allows the resin composition to have much better toughness.

The tensile strain at break may be measured by a tensile test using a Type V specimen in conformity with ASTM D638.

The resin composition of the disclosure may be used for a circuit board. In particular, the resin composition of the disclosure is preferably used for an insulating layer of a circuit board.

The circuit board is preferably a printed circuit board. This printed circuit board may be a rigid printed circuit board, a flexible printed circuit board, or a rigid flexible printed circuit board.

The circuit board is preferably a high-frequency circuit board. A high-frequency circuit board is a circuit board operable even within a high-frequency band. The high-frequency band may be a band of 1 GHz or above, preferably a band of 3 GHz or above, more preferably a band of 5 GHz or above. The upper limit of the band may be, but is not limited to, 100 GHz or below.

The resin composition of the disclosure has excellent low-dielectric characteristics and excellent heat conduction and therefore can provide a circuit board having a low transmission loss even within a high-frequency band and having excellent heat dissipation.

The resin composition of the disclosure can be suitably used for a circuit board for 5th generation mobile communication system.

The disclosure also relates to a molded article for a circuit board obtainable from the resin composition of the disclosure. The molded article of the disclosure is obtainable from the resin composition of the disclosure and therefore has excellent low-dielectric characteristics, excellent heat dissipation, excellent low thermal expansion, excellent toughness, and excellent heat resistance.

The molded article of the disclosure is obtainable by molding the resin composition of the disclosure.

The resin composition may be molded by any method, such as injection molding, extrusion molding, compression molding, blow molding, film molding, or wire coating extrusion. The resin composition of the disclosure has excellent fluidity and therefore can be suitably molded by injection molding or extrusion molding.

The molded article may have any of various shapes such as a sheet shape, a film shape, a rod shape, and a pipe shape.

The molded article is preferably a sheet or a film.

The molded article may be surface-modified on one or both of the surfaces. Surface modification is preferred in that it can improve the adhesiveness to a metal layer such as copper foil.

A specific method for the surface modification may be, but is not limited to, any known method. Specific examples thereof include discharge treatments such as corona discharge treatment, glow discharge treatment, plasma discharge treatment, and sputtering treatment. For example, the surface free energy can be controlled by introducing oxygen gas, nitrogen gas, hydrogen gas, or the like into a discharge atmosphere. Alternatively, surface modification may be performed as follows. Specifically, a surface to be modified is exposed to an atmosphere of inert gas (e.g., nitrogen gas, helium gas, argon gas) containing an organic compound and a high-frequency voltage is applied between electrodes to cause discharge, thereby generating an active species on the surface. Then, the functional group of the organic compound is introduced or a polymerizable organic compound is graft-polymerized, whereby the surface is modified.

The surface modification is particularly preferred for a molded article in the form of sheet or film.

The molded article of the disclosure can be suitably used for an insulating layer of a circuit board, for example.

The disclosure also relates to a laminate for a circuit board including a metal layer (A1) and a layer (B) obtainable from the aforementioned resin composition of the disclosure.

The metal layer (A1) is composed of metal that preferably includes at least one selected from the group consisting of copper, stainless steel, aluminum, iron, and alloy of any of these, more preferably at least one selected from the group consisting of copper, stainless steel, and aluminum, and is still more preferably copper.

Examples of the stainless steel include austenite-based stainless steel, martensite-based stainless steel, and ferrite-based stainless steel.

The metal layer (A1) may be a layer formed by sputtering, vacuum deposition, electroplating, electroless plating, or the like, or may be a layer formed from metal foil.

The metal layer (A1) formed from metal foil may be formed by bonding the metal foil to the layer (B) by heat pressing.

The metal layer (A1) may have a thickness of 2 to 200 μm, preferably 5 to 50 μm.

The metal layer (A1) may be provided on one surface of the layer (B) or may be provided on both surfaces thereof.

The layer (B) is obtainable from the resin composition of the disclosure. The layer (B) used may be the aforementioned molded article of the disclosure.

The layer (B) is preferably a sheet or film obtainable from the resin composition of the disclosure.

The aforementioned surface modification may be performed on one or both of the surfaces of the layer (B).

The layer (B) may have a thickness of 1 μm to 1 mm, preferably 1 to 500 μm, more preferably 150 μm or smaller, still more preferably 100 μm or smaller.

The laminate may further include a layer other than the metal layer (A1) and the layer (B).

The laminate of the disclosure may be suitably used as a metal-clad laminate for forming a circuit board.

The disclosure also relates to a circuit board including a metal layer (A2) and a layer (B) obtainable from the aforementioned resin composition of the disclosure.

Examples of the metal constituting the metal layer (A2) include the same as those for constituting the metal layer (A1). The same applies to the thickness.

The layer (B) is the same as the layer (B) of the laminate of the disclosure.

The metal layer (A2) constitutes a circuit. A circuit pattern may be formed by any method, such as a method of forming a metal layer with no pattern on the layer (B) and then etching the metal layer to form a pattern, a method of forming a metal layer directly on a portion required for the circuit pattern on the layer (B), or a combination of these methods. In each case, a conventionally known method may be used.

The circuit board of the disclosure may be prepared by patterning the metal layer (A1) in the laminate of the disclosure.

The metal layer (A2) may be provided on one surface of the layer (B) or may be provided on both surfaces thereof. The circuit board may further include a layer other than the metal layer (A2) and the layer (B). The aforementioned surface modification may be performed on one or both of the surfaces of the layer (B).

The circuit board of the disclosure is preferably a printed circuit board. The specifications of the printed circuit board are as described above.

The circuit board of the disclosure is also preferably a high-frequency circuit board. The specifications of the high-frequency circuit board are as described above.

The circuit board of the disclosure is also preferably a circuit board for 5th generation mobile communication system.

The disclosure relates to a resin composition for a circuit board containing a melt-fabricable fluororesin and a particulate boron nitride.

Preferably, the melt-fabricable fluororesin represents 35 to 70% by mass and the particulate boron nitride represents 30 to 65% by mass of the resin composition, and the resin composition has a melt flow rate of 5.0 g/10 min or higher.

The particulate boron nitride preferably has a ratio (b)/(a) of 1.0 or higher, wherein (a) represents a proportion of particles having a particle size of 14.6 to 20.6 μm and (b) represents a proportion of particles having a particle size of 24.6 to 29.4 μm.

The particulate boron nitride preferably has a proportion (a) of particles having a particle size of 14.6 to 20.6 μm of 5.0% or lower.

The particulate boron nitride preferably has a proportion (b) of particles having a particle size of 24.6 to 29.4 μm of 10.0% or lower.

The melt-fabricable fluororesin preferably contains at least one selected from the group consisting of a tetrafluoroethylene/perfluoro(alkyl vinyl ether) copolymer, a tetrafluoroethylene/hexafluoropropylene copolymer, and an ethylene/tetrafluoroethylene copolymer.

The disclosure also relates to a molded article for a circuit board obtainable from the resin composition.

The disclosure also relates to a laminate for a circuit board including a metal layer (A1) and a layer (B) obtainable from the resin composition.

The disclosure also relates to a circuit board including a metal layer (A2) and a layer (B) obtainable from the resin composition.

The circuit board is preferably a printed circuit board.

The circuit board is also preferably a high-frequency circuit board.

The circuit board is also preferably a circuit board for 5th generation mobile communication system.

EXAMPLES

The disclosure is described in more detail below with reference to examples, but the disclosure is not limited to these examples.

The physical properties in the examples and comparative example were determined by the following methods.

Thermal Conductivity

The thermal conductivity was calculated as the product of the thermal diffusivity, specific heat capacity, and density measured by the following methods.

(Thermal Diffusivity)

Device: thermowave analyzer TA33 available from Bethel Co., Ltd.

Method: periodical heating radiation-temperature measurement

Measurement temperature: 25° C.

With a sample produced by the following method, measurement was performed in the thickness direction and the in-plane direction.

Sample: a 0.5-mmt plate obtained by press-molding

Measurement was performed with N=3 and the average thereof was used.

*Conditions for press-molding a sample

Device: heat press IMC-11FA available from Imoto Machinery Co., Ltd.

Molding temperature: 360° C.

Pressure: 10 MPa

Press duration: 2 min (Specific Heat Capacity)

The specific heat capacity was measured in conformity with JIS K 7123, and the value at 25° C. was used.

(Density)

The density was measured in conformity with JIS Z 8807.

Relative Permittivity and Dissipation Factor

The relative permittivity and dissipation factor were measured at 6 GHz and 25° C. using a cavity resonator for permittivity measurement (Network analyzer system available from Agilent Technologies) in conformity with ASTM D150.

Linear Expansion Coefficient

The linear expansion coefficient was determined in conformity with JIS K 7177.

MFR

The MFR was obtained as the mass (g/10 min) of a polymer that flows out of a nozzle having an inner diameter of 2 mm and a length of 8 mm per 10 minutes at 372° C. and a load of 5 kg using a melt indexer in conformity with ASTM D1238.

Particle Size Distribution of Particulate Boron Nitride in Resin Composition

A nickel crucible was charged with 5 g of pellets of the resin composition. The contents were superheated at 600° C. for two hours in an electric muffle furnace (FUW222PA, available from Advantech Toyo Kaisha, Ltd.), so that the resin was incinerated. Thereby, an incineration residue was obtained.

The resulting residue was subjected to measurement using a laser diffraction particle size distribution analyzer (RODOS T4.1, available from Sympatec GmbH) under the following conditions.

(Measurement Conditions)

Measurement range: R1 (0.18 to 35 μm)

Dispersion pressure: 3 bar

Amount of sample: 1 g

In the examples and comparative example, the following materials were used.

(Fluororesin)

PFA 1: tetrafluoroethylene/perfluoro(alkyl vinyl ether) copolymer, MFR=72 g/10 min (Boron Nitride)

BN 1: agglomerated particulate boron nitride UHP-G1H available from Showa Denko K.K., average particle size 50 μm Example 1

A resin composition was produced by melt-kneading 60 parts by mass of the fluorine resin (PFA 1) and 40 parts by mass of the boron nitride (BN 1). The melt-kneading was performed at 380° C. using a twin-screw extruder (MFU20TW available from Technovel Corp.). The boron nitride was fed from a side feeder. The resulting resin composition was used for evaluation. The results are shown in Table 1.

Example 2

The resin composition was produced and used for evaluation as in Example 1, except that the amounts of the fluororesin and the boron nitride were changed as shown in Table 1. The results are shown in Table 1.

Comparative Example 1

PFA 1 alone was used for evaluation as in Example 1. The results are shown in Table 1.

TABLE 1

| | | Example 1 | Example 2 | Comparative Example 1 |
|---|---|---|---|---|
| Composition (mass %) | PFA1 | 60 | 50 | 100 |
| | BN1 | 40 | 50 | 0 |
| Particle size distribution of particulate boron nitride | D10 (μm) | 0.8 | 0.8 | — |
| | D50 (μm) | 2.6 | 2.5 | — |
| | D90 (μm) | 5.8 | 5.4 | — |
| | Max (μm) | 29.4 | 29.4 | — |
| | Proportion 14.6 to 20.6 μm (%) | 0.74 | 0.06 | — |
| | Proportion 24.6 to 29.4 μm (%) | 1.09 | 0.17 | — |
| | (Proportion 24.6 to 29.4 μm)/(Proportion 14.6 to 20.6 μm) | 1.5 | 2.8 | — |
| Evaluation of composition | Thermal conductivity (thickness) (W/m · K) | 0.9 | 1.1 | 0.2 |
| | Thermal conductivity (in-plane) (W/m · K) | 2.8 | 4.0 | 0.2 |
| | Relative permittivity | 2.6 | 2.8 | 2.0 |
| | Dissipation factor ($\times 10^{-4}$) | 8.7 | 7.9 | 12.6 |
| | Linear expansion coefficient ($\times 10^{-5}$/° C.) | 7 | 7 | 13 |
| | MFR(g/10 min) | 16 | 6 | 72 |

Examples 1 and 2, compared to Comparative Example 1, exhibited a reduced increase in the relative permittivity (permittivity) and a reduced dissipation factor, as well as excellent characteristics such as excellent thermal conductivity.

What is claimed is:

1. A resin composition for a circuit board, comprising a melt-fabricable fluororesin and a particulate boron nitride, wherein the particulate boron nitride has a ratio (b)/(a) of 1.0 or higher, wherein (a) represents a proportion of particles having a particle size of 14.6 to 20.6 μm and (b) represents a proportion of particles having a particle size of 24.6 to 29.4 μm, and
    wherein a proportion of particles having a particle size of 35.0 μm or greater is 0.1% or less.

2. The resin composition according to claim 1, wherein the particulate boron nitride has a proportion (a) of particles having a particle size of 14.6 to 20.6 μm of 5.0% or lower.

3. The resin composition according to claim 1, wherein the particulate boron nitride has a proportion (b) of particles having a particle size of 24.6 to 29.4 μm of 10.0% or lower.

4. The resin composition according to claim 1, wherein the melt-fabricable fluororesin comprises at least one selected from the group consisting of a tetrafluoroethylene/perfluoro(alkyl vinyl ether) copolymer, a tetrafluoroethylene/hexafluoropropylene copolymer, and an ethylene/tetrafluoroethylene copolymer.

5. A molded article for a circuit board, obtained from the resin composition according to claim 1.

6. A laminate for a circuit board, comprising a metal layer (A1) and a layer (B) obtained from the resin composition according to claim 1.

7. A circuit board comprising a metal layer (A2) and a layer (B) obtained from the resin composition according to claim 1.

8. The circuit board according to claim 7,
wherein the circuit board is a printed circuit board.

9. The circuit board according to claim 7,
wherein the circuit board is a high-frequency circuit board.

10. The circuit board according to claim 7,
wherein the circuit board is a circuit board for 5th generation mobile communication system.

\* \* \* \* \*